(12) United States Patent
Takayoshi et al.

(10) Patent No.: US 11,705,374 B2
(45) Date of Patent: Jul. 18, 2023

(54) SUBSTRATE PROCESSING METHOD AND SUBSTRATE PROCESSING APPARATUS

(71) Applicant: Tokyo Electron Limited, Tokyo (JP)

(72) Inventors: Joji Takayoshi, Miyagi (JP); Hidehiko Sato, Miyagi (JP); Tomoyuki Kudoh, Miyagi (JP); Hiroaki Mochizuki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 119 days.

(21) Appl. No.: 17/220,435

(22) Filed: Apr. 1, 2021

(65) Prior Publication Data
US 2021/0313238 A1    Oct. 7, 2021

(30) Foreign Application Priority Data

Apr. 2, 2020   (JP) .................................. 2020-066978

(51) Int. Cl.
*H01L 21/66*      (2006.01)
*H01L 21/67*      (2006.01)

(52) U.S. Cl.
CPC ........ *H01L 22/20* (2013.01); *H01L 21/67253* (2013.01)

(58) Field of Classification Search
CPC ... H01L 22/20; H01L 21/67253; H01L 22/12; H01L 21/67069; H01L 21/31116; H01L 21/31144; H01L 21/32135; H01L 21/32139
See application file for complete search history.

(56) References Cited

U.S. PATENT DOCUMENTS

| | | | | |
|---|---|---|---|---|
| 2004/0192057 A1* | 9/2004 | Wieczorek | ........ | H01L 21/31116 |
| | | | | 257/E21.252 |
| 2004/0235205 A1* | 11/2004 | Levy | ................. | G01N 21/9501 |
| | | | | 257/E21.53 |
| 2018/0323060 A1* | 11/2018 | Katagiri | ............ | H01L 21/31116 |
| 2019/0226092 A1* | 7/2019 | Mosshammer | ........ | C23C 14/562 |

FOREIGN PATENT DOCUMENTS

JP    2008-103424 A    5/2008

\* cited by examiner

*Primary Examiner* — Thomas C Lee
*Assistant Examiner* — Charles Cai
(74) *Attorney, Agent, or Firm* — Nath, Goldberg & Meyer; Jerald L. Meyer; Tanya E. Harkins

(57) ABSTRACT

A substrate processing method includes performing a post-processing on a substrate subjected to a pre-processing, in the multiple chambers, acquiring a characteristic value of the substrate after the post-processing for respective chambers, calculating an actual value being an estimated value of the characteristic value when a processing condition of the post-processing is adjusted such that a difference between the characteristic value and a target value becomes small, acquiring a correction residual amount being a difference between the actual value and the target value for each chamber, calculating an average value of correction residual amounts of all of the chambers, correcting the pre-processing condition based on the average of the correction residual amounts, correcting the post-processing condition for each chamber based on the average of the correction residual amounts and the correction residual amount for each chamber; and performing the pre-processing and the post-processing based on the corrected conditions.

10 Claims, 8 Drawing Sheets

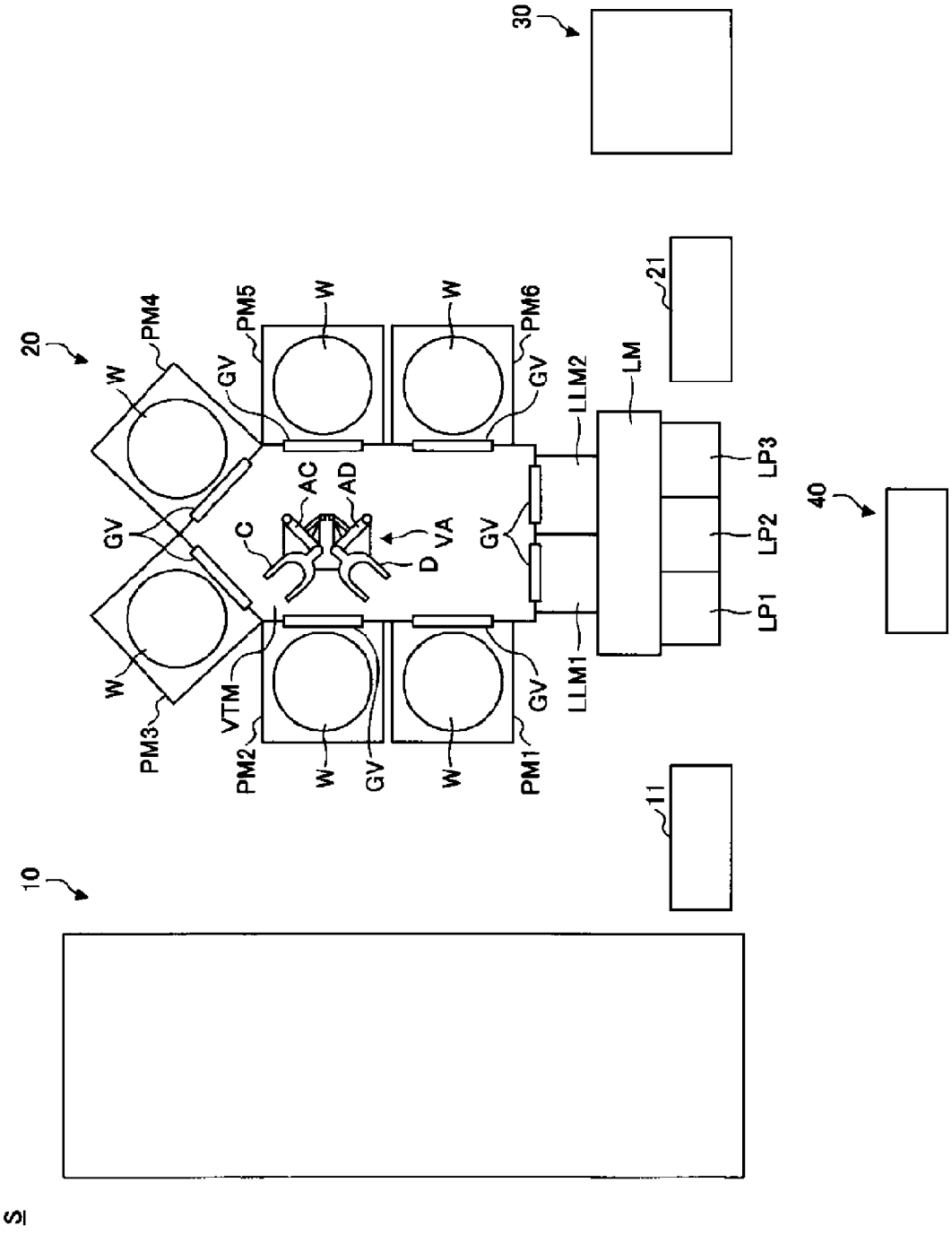

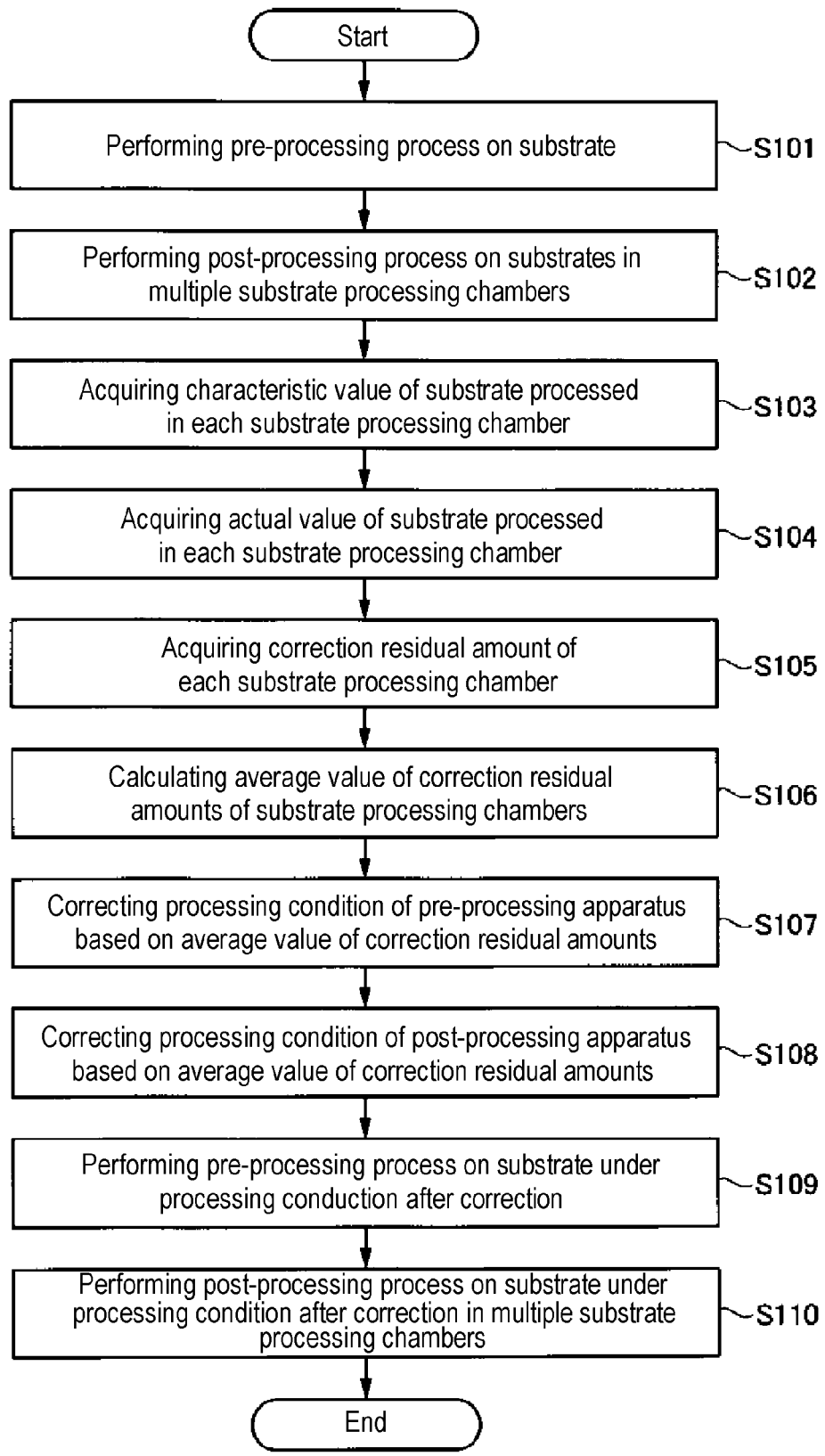

US 11,705,374 B2

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2020-066978, filed on Apr. 2, 2020, the entire contents of which are incorporated herein by reference.

TECHNICAL FIELD

The present disclosure relates to a substrate processing method and a substrate processing apparatus.

BACKGROUND

A substrate processing apparatus that performs a predetermined process on a substrate is known.

Patent Document 1 discloses a control device that controls a substrate processing apparatus that performs a predetermined processing on a substrate, in which the control device includes: a storage part configured to store a predetermined target value that is a control value when the predetermined processing is performed on a substrate; a communication part configured to cause a measurement device to measure the processing state of the substrate processed by the substrate processing apparatus and to receive the measured information; a calculation part configured to calculate a feedback value according to the processed state of the substrate processed in the current cycle, based on the pre-processing and post-processing measurement information for the substrate processed in the current cycle among the measurement information received by the communication part and to calculate a change value of the feedback value currently calculated by the calculation part relative to any of feedback values calculated before the current cycle; a determination part configured to determine whether to discard the currently calculated feedback value by comparing the change value of the feedback value calculated by the calculation part with a predetermined threshold; and an update part configured to update the target value stored in the storage part using the currently calculated feedback value when the determination part determines not to discard the feedback value.

PRIOR ART DOCUMENT

Patent Document

Patent Document 1: Japanese Laid-Open Patent Publication No. 2008-103424

SUMMARY

According to one embodiment of the present disclosure, there is provided a substrate processing method of processing a plurality of substrates through a pre-processing process and a post-processing process, in which at least in the post-processing process, the plurality of substrates is processed in parallel in multiple chambers, the substrate processing method includes performing the post-processing process on the substrate, which has been processed in the pre-processing process, in parallel in the multiple chambers; acquiring a characteristic value of each of the substrates after performing the post-processing process for each of the chambers, calculating an actual value, which is an estimated value of the characteristic value when a processing condition of the post-processing process is adjusted such that a difference between the characteristic value and a target value becomes small, acquiring a correction residual amount, which is a difference between the actual value and the target value for each chamber, calculating an average value of correction residual amounts of all of the chambers, correcting a processing condition of the pre-processing process based on the average value of the correction residual amounts, correcting the processing condition of the post-processing process for each chamber based on the average value of the correction residual amounts and the correction residual amount for each chamber; and performing the pre-processing process and the post-processing process based on the corrected processing conditions.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a view illustrating an exemplary configuration of a substrate processing apparatus according to an embodiment.

FIG. 2 is a flowchart illustrating an exemplary operation of the substrate processing apparatus according to the embodiment.

DETAILED DESCRIPTION

Figure 3A:
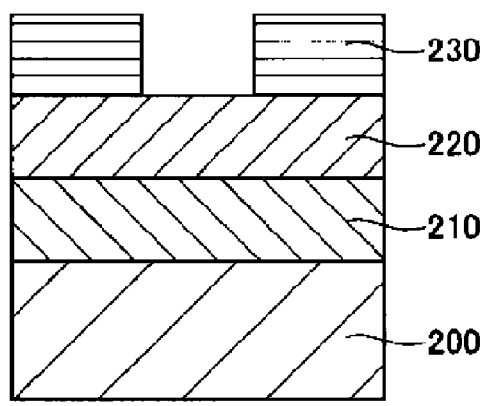
FIGS. 3A to 3C are exemplary schematic cross-sectional views of a substrate in a first example.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

<Substrate Processing Apparatus 5>

A substrate processing apparatus S according to an embodiment will be described with reference to FIG. 1. FIG. 1 is a view illustrating an exemplary configuration of a substrate processing apparatus S according to an embodiment. The substrate processing apparatus S is an apparatus that performs pre-processing process and post-processing process on a substrate W such as a semiconductor wafer.

The substrate processing apparatus S includes a pre-processing apparatus 10, which performs pre-processing process on the substrate W, a post-processing apparatus 20, which performs post-processing process on the substrate W, which has been subjected to pre-processing process, a measurement device 30, and an overall control device 40.

The pre-processing apparatus 10 is controlled by a controller 11 to perform pre-processing process on the substrate W. The controller 11 controls the pre-processing apparatus 10 based on a predetermined processing condition, and performs the pre-processing process on the substrate W. The substrate W, which has been subjected to the pre-processing process by the pre-processing apparatus 10, is accommodated in a carrier such as a front opening unified pod (FOUP), and is transferred to the post-processing apparatus 20.

The post-processing apparatus 20 performs post-processing process on the substrate W, which has been subjected to the pre-processing process. Here, the post-processing apparatus 20 is a processing apparatus having a cluster structure (a multi-chamber type).

In the example illustrated in FIG. 1, the post-processing apparatus 20 includes substrate processing chamber (process modules) PM1 to PM6, a transfer chamber (vacuum transfer module) VTM, load lock chambers (load lock modules) LLM1 and LLM2, a loader module LM, and load ports LP1 to LP3.

The post-processing apparatus 20 is controlled by a controller 21 to perform post-processing process on the substrate W. The controller 21 controls the post-processing apparatus 20 based on the processing conditions of respective substrate processing chambers PM1 to PM6, and performs post-processing process on the substrate W.

The substrate processing chambers PM1 to PM6 are arranged adjacent to the vacuum transfer chamber VTM. The substrate processing chambers PM1 to PM6 are also collectively referred to as a substrate processing chamber PM. Each of the substrate processing chambers PM1 to PM6 and the transfer chamber VTM communicate with each other by opening and closing a gate valve GV. The substrate processing chambers PM1 to PM6 are depressurized to a predetermined vacuum atmosphere, and the substrate W is subjected to desired processes (e.g., an etching process, a film formation process, a cleaning process, and an ashing process) therein.

Inside the transfer chamber VTM, a transfer apparatus VA configured to transfer the substrate W is arranged. The transfer apparatus VA has two robot arms AC and AD, which are freely bendable and rotatable. Picks C and D are installed at the tips of the robot arms AC and AD, respectively. The transfer apparatus VA is capable of holding the substrate W in each of the picks C and D, and carries in and out the substrate W between the substrate processing chambers PM1 to PM6 and the transfer chamber VTM according to the opening and closing of the gate valves GV. In addition, the transfer apparatus VA carries in and out the substrate W between the transfer chamber VTM and the load lock chambers LLM1 and LLM2 according to the opening and closing of the gate valves GV.

The load lock chambers LLM1 and LLM2 are provided between the transfer chamber VTM and the loader module LM. The load lock chambers LLM1 and LLM2 switch between an atmospheric atmosphere and a vacuum atmosphere so as to transfer the substrate W from the loader module LM on the atmospheric side to the transfer chamber VTM on the vacuum side, or from the transfer chamber VTM on the vacuum side to the loader module LM on the atmospheric side.

The loader module LM is provided with load ports LP1 to LP3. In each of the load ports LP1 to LP3, a FOUP in which the substrate W subjected to pre-processing process by the pre-processing apparatus 10 is accommodated or an empty FOUP is placed. The loader module LM carries the substrate W, which is carried out from a FOUP in any of the load ports LP1 to LP3, into any of the load lock chambers LLM1 and LLM2, and carries the substrate W, which is carried out from any of the load lock chambers LLM1 and LLM2 is into a FOUP.

With this configuration, the substrate W, which has been subjected to pre-processing process, is transferred to any of the substrate processing chambers PM1 to PM6 via the loader module LM, the load lock chamber LLM1 or LLM2, and the transfer chamber VTM, and post-processing process is performed thereon. The substrate W subjected to the post-processing process is received in a FOUP via the transfer chamber VTM, the load lock chamber LLM1 or LLM2, and the loader module LM.

The measurement device 30 is a device that measures results of processing the substrate W on which post-processing process has been performed by the post-processing apparatus 20. When the post-processing process is an etching process, the measurement device 30 measures, for example, a critical dimension (CD) value or an etching depth. The measurement results by the measurement device 30 are transmitted to the overall control device 40.

The overall control device 40 determines the processing conditions of the pre-processing apparatus 10 and the processing conditions of each of the substrate processing chambers PM1 to PM6 of the post-processing apparatus 20 based on the measurement results by the measurement device 30. The determined processing conditions of the pre-processing apparatus 10 are transmitted to the controller 11 of the pre-processing apparatus 10. In addition, the determined processing conditions of each of the substrate processing chambers PM1 to PM6 of the post-processing apparatus 20 are transmitted to the controller 21 of the post-processing apparatus 20.

<Operation of Substrate Processing Apparatus 5>

Figure 3B:
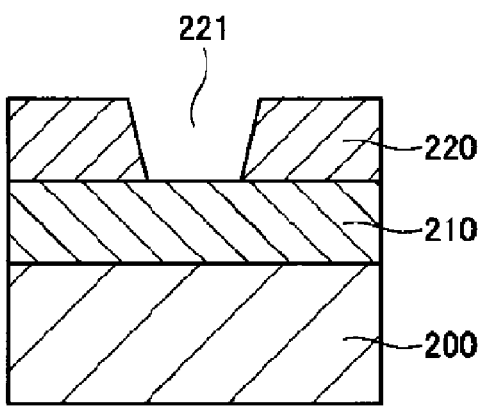
Figure 3C:
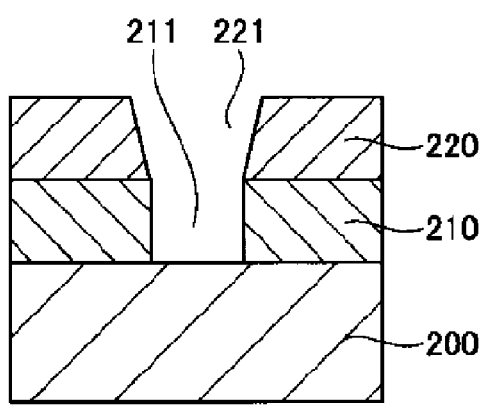

Next, an exemplary operation of the substrate processing apparatus S will be described with reference to FIGS. 2 and 3A to 3C. FIG. 2 is a flowchart illustrating an exemplary operation of the substrate processing apparatus S according to the present embodiment. FIGS. 3A to 3C are exemplary schematic cross-sectional views of the substrate W in the first example. In the substrate W (see FIG. 3A), an etching target film 210, a hard mask film 220, and a mask pattern 230 are formed on a base 200. Here, the substrate processing apparatus S will be described with reference to the case in which, as a pre-processing process, an etching process is performed on the substrate W having the base 200 on which the etching target film 210, the hard mask film 220, and the mask pattern 230 are formed (see FIG. 3A), through the mask pattern 230 so as to form an opening 221 in the hard mask film 220 (see FIG. 3B), as an example. The mask pattern 230 is formed of, for example, an organic film, and has a hole or a linear opening. The substrate processing apparatus S will also be described with reference to the case in which, as a post-processing process, an etching process is performed on the etching target film 210 using the hard mask film 220 having the opening 221 as a mask so as to form an opening 211 (see FIG. 3C), as an example. In addition, the case in which a characteristic value of a control target is the critical dimension (CD) value of the etching target film 210 will be described as an example.

In step S101, the overall control device 40 performs pre-processing process on the substrate W using the pre-processing apparatus 10. Here, the controller 11 of the pre-processing apparatus 10 performs the pre-processing process on the substrate W under predetermined processing conditions. Here, FIG. 3A illustrates the substrate W before being processed. In the substrate W, the etching target film 210, the hard mask film 220, and the mask pattern 230 are formed on the base 200. FIG. 3B illustrates the substrate W after pre-processing process has been performed thereon. By the pre-processing process, the opening 221 is formed in the hard mask film 220 of the substrate W.

In step S102, the overall control device 40 performs post-processing process on the substrates W in the multiple substrate processing chambers PM1 to PM6 of the post-processing apparatus 20. That is, the substrate W subjected to the pre-processing process in step S101 is transferred to any one of the substrate processing chambers PM1 to PM6, and is subjected to post-processing process. The controller 21 of the post-processing apparatus 20 performs post-processing process on the substrate W under predetermined processing conditions. Here, FIG. 3C illustrates the substrate W after the post-processing process has been performed thereon. By using the hard mask film 220 having the opening 221 as a mask and performing an etching process on the etching target film 210, the opening 211 is formed in the etching target film 210 of the substrate W.

In step S103, the overall control device 40 acquires a characteristic value of the substrate W processed in each of the substrate processing chambers PM1 to PM6. That is, the measurement device 30 measures the characteristic value (CD value) of the substrate W on which the post-processing process has been performed in step S102. Here, the characteristic value refers to a parameter that requires accuracy when pre-processing process and post-post processing are performed on the substrate W. In addition, the characteristic value required when the pre-processing process and the post-processing process are performed on the substrate W is referred to as a target value. The characteristic value (CD value) may be a value measured on one substrate W or an average value of respective values measured on multiple substrates W.

In step S104, the overall control device 40 calculates an actual value of the substrate W processed in each of the substrate processing chambers PM1 to PM6. Here, the actual value refers to an estimated value of the characteristic value when the processing conditions of the post-processing process in the substrate processing chamber PM are adjusted so that the characteristic value is closest to the target value. The overall control device 40 may have a table, a simulation model, or the like representing the amounts of change in the characteristic value when the processing conditions in the post-processing process are changed. The overall control device 40 may calculate the actual value based on a table representing a characteristic value in the substrate processing chamber PM under the predetermined processing conditions measured in step S103 and the amount of change in the characteristic value with respect to process parameters (e.g., electric power, pressure, gas flow rate, temperature, and processing time).

In step S105, the overall control device 40 acquires a correction residual amount of each of the substrate processing chambers PM1 to PM6. The overall control device 40 calculates the correction residual amount, which is the difference between the actual value and the target value of each of the substrate processing chambers PM1 to PM6. That is, the correction residual amount refers to the deviation (residual) between the characteristic value and the target value that cannot be adjusted even if the processing conditions of the post-processing process are adjusted. Here, assuming that the actual value is A and the target value is X, the correction residual amount B can be represented as "B=X−A". That is, when the actual value A is smaller than the target value X, B becomes a positive value. When the actual value A is greater than the target value X, B becomes a negative value.

In step S106, the overall control device 40 calculates the average value of the correction residual amounts of respective substrate processing chambers PM1 to PM6.

In step S107, the overall control device 40 corrects the processing conditions of the pre-processing apparatus 10 based on the average value of the correction residual amounts. Here, when the average value of the correction residual amounts is a positive value, the diameter, width or a shape (e.g., a tapered shape or a vertical shape) of the opening 221 of the hard mask film 220 is determined such that the characteristic value (CD value) in the opening 211 in the etching target film 210 is increased by the average value of the correction residual amounts (for example, the opening 221 in the hard mask film 220 is enlarged). When the average value of the correction residual amounts is a negative value, the diameter, width, or a shape of the opening 221 in the hard mask film 220 is determined such that the characteristic value (CD value) of the opening 211 in the etching target film 210 is decreased by the average value of the correction residual amounts (for example, the opening 221 in the hard mask film 220 is reduced). The processing conditions of the pre-processing apparatus 10 are corrected (determined) based on the determined diameter, width, and shape of the opening 221 in the hard mask film 220.

The overall control device 40 may store in advance a table in which the average value of correction residual amounts and the processing conditions of the pre-processing apparatus 10 are associated with each other. The overall control device 40 corrects (determines) the processing conditions of the pre-processing apparatus 10 based on the average value of correction residual amounts and the table.

In step S108, the overall control device 40 corrects the processing conditions of respective substrate processing chambers PM1 to PM6 of the post-processing apparatus 20 based on the average value of correction residual amounts and the characteristics of respective substrate processing chambers PM1 to PM6 acquired in step S103.

Here, the overall control device 40 corrects (determines) the processing conditions of the respective substrate processing chambers PM1 to PM6 such that the characteristic values approach the target values in response to a change in the pre-processing process. At this time, the correction may be performed with reference to the table representing the amounts of change in characteristic values with respect to process parameters.

In addition, the overall control device 40 determines whether or not the correction is overcorrection based on the average value of correction residual amounts and the correction residual amount of respective substrate processing chambers PM1 to PM6. When the correction is overcorrection (the average value of correction residual amounts>a correction residual amount), the processing conditions are corrected such that the actual value approaches (matches) the target value. When the correction is not overcorrection (the average value of correction residual amount<a correction residual amount), the processing conditions are corrected so that the actual value approaches as closely as possible the target value.

In step S109, the overall control device 40 performs pre-processing process on the substrate W using the pre-processing apparatus 10 under the processing conditions after correction. Here, the controller 11 of the pre-processing apparatus 10 performs pre-processing process on the substrate W under new processing conditions corrected in step S107.

In step S110, the overall control device 40 performs post-processing process on the substrate W in the multiple substrate processing chambers PM1 to PM6 of the post-processing apparatus 20 under the processing conditions after correction. Here, the controller 21 of the post-processing apparatus 20 performs post-processing process on the substrate W under new processing conditions corrected in step S108.

Figure 4A:
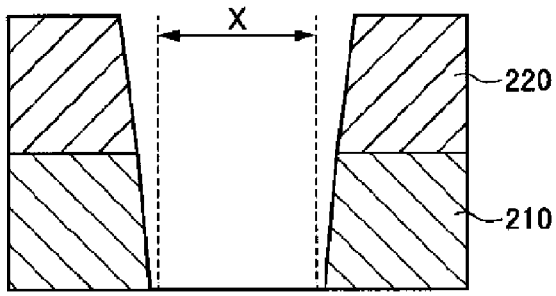
FIGS. 4A to 4E are conceptual views illustrating correction of processing conditions in the first example.
Figure 4B:
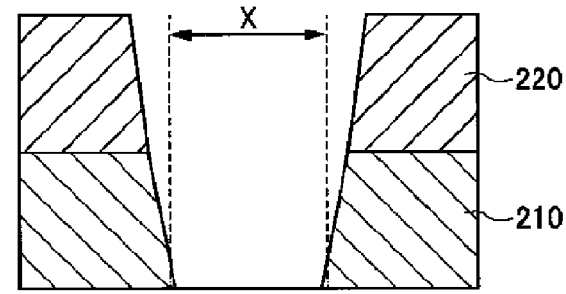

FIGS. 4A to 4E are conceptual views illustrating correction of processing conditions in the first example. FIGS. 4A and 4B illustrate substrates W after processed in steps S101 to S105. As illustrated in FIG. 4A, in a certain substrate processing chamber PM, the actual value becomes larger than the target value X. As illustrated in FIG. 4B, in a certain substrate processing chamber PM, the actual value becomes smaller than the target value X.

Figure 4C:
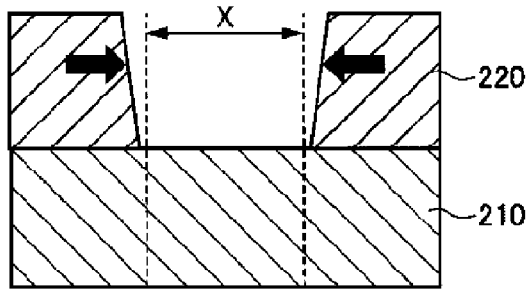

Then, in step S106 and step S107, the processing conditions of the pre-processing apparatus 10 are corrected. That is, as illustrated in FIG. 4C, the processing conditions in the step of etching the hard mask film 220, which is a pre-processing process, are changed to change the diameter, width, and shape of the opening 221 in the hard mask film 220.

Figure 4D:
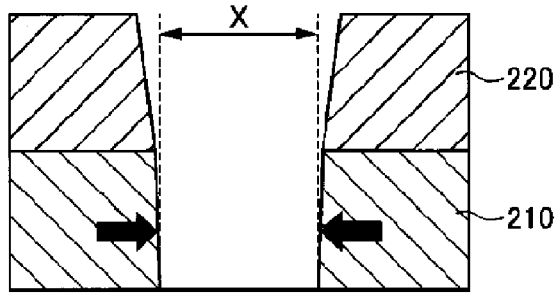
Figure 4E:
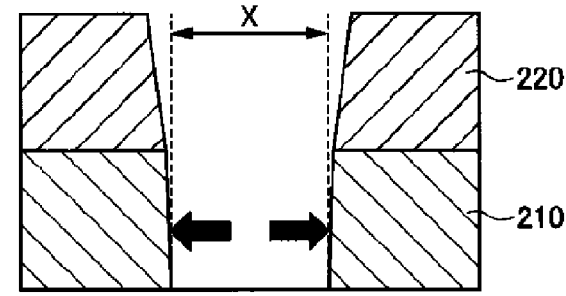

Then, in step S108, the processing conditions of the post-processing apparatus 20 are corrected for each substrate processing chamber PM. As a result, FIGS. 4D and 4E illustrate the processing results of post-processing process under the corrected processing conditions. This makes it possible to suppress the variation of the characteristic values (CD values) among the substrate processing chambers PM.

In the first example, the CD value of the opening 211 in the etching target film 210 has been described as an example as the characteristic value, but the characteristic value is not limited thereto.

Figure 5A:
FIGS. 5A to 5F are exemplary schematic cross-sectional views of a substrate in a second example.
Figure 5B:
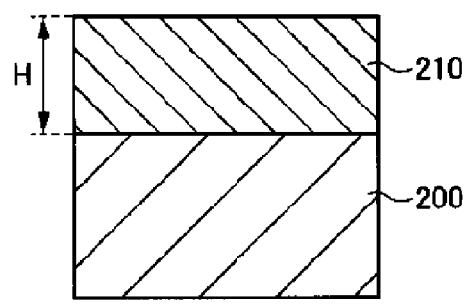
Figure 5C:
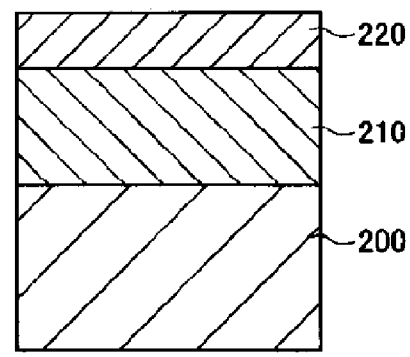
Figure 5D:
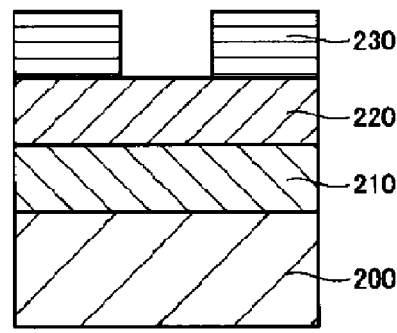
Figure 5E:
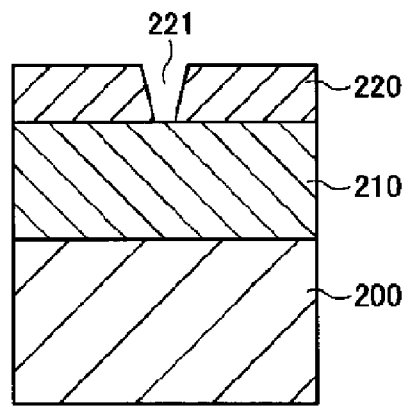
Figure 5F:
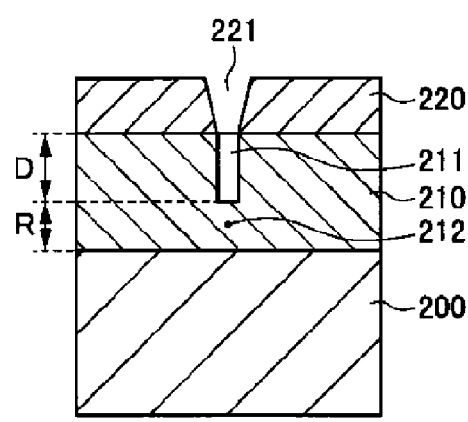

FIGS. 5A to 5F are exemplary schematic cross-sectional views of a substrate W in a second example. The second example includes a step of forming an etching target film 210, a step of forming a hard mask film 220, a step of forming a mask pattern 230, a step of etching the hard mask film 220, and a step of etching the etching target film 210. FIG. 5A illustrates the substrate W before being processed. The substrate W has a base 200. FIG. 5B illustrates the substrate W after the step of forming the etching target film 210. In the substrate W, the etching target film 210 having a film thickness H is formed on the base 200. FIG. 5C illustrates the substrate W after the step of forming the hard mask film 220. In the substrate W, the hard mask film 220 is formed on the etching target film 210. FIG. 5D illustrates the substrate W after the step of forming the mask pattern 230. In the substrate W, the mask pattern 230 is formed on the hard mask film 220. FIG. 5E illustrates the substrate W after the step of etching the hard mask film 220. An opening 221 is formed in the hard mask film 220 of the substrate W. FIG. 5F illustrates the substrate W after the step of etching the etching target film 210. An opening 211 having an etching depth D is formed in the etching target film 210 of the substrate W. Here, a thin film portion 212 is provided between the bottom portion of the opening 211 and the base 200. In the second example, the film thickness R of the thin film portion 212 is controlled to be a desired film thickness.

In the second example, the step of forming the etching target film 210 is a pre-processing process, and the step of etching the etching target film 210 is a post-processing process. In addition, the characteristic value of a control target is the etching depth D of the opening 211 in the etching target film 210.

Next, the second example will be described with reference to FIG. 2.

In step S101, the overall control device 40 performs the pre-processing process on a substrate W using the pre-processing apparatus 10. Here, an etching target film 210 having a predetermined film thickness H is formed on the base 200.

Thereafter, the substrate W is subjected to a step of forming a hard mask film 220, a step of forming a mask pattern 230, and a step of etching a hard mask film 220.

In step S102, the overall control device 40 performs the post-processing process on the substrate W in the multiple substrate processing chambers PM1 to PM6 of the post-processing apparatus 20. Here, the etching target film 210 is etched using the hard mask film 220 having an opening 221 as a mask.

In step S103, the overall control device 40 acquires the characteristic value of the substrate W processed in each of the substrate processing chambers PM1 to PM6. That is, the measurement device 30 measures the characteristic value (etching depth D) of the substrate W on which the post-processing process has been performed in step S102. Here, a target value of the etching depth D is calculated from the difference between the thickness H of the etching target film 210 formed in step S101 and the required thickness R of the thin film portion 212.

In step S104, the overall control device 40 calculates an actual value of the substrate W processed in each of the substrate processing chambers PM1 to PM6.

In step S105, the overall control device 40 acquires a correction residual amount of each of the substrate processing chambers PM1 to PM6.

In step S106, the overall control device 40 calculates an average value of the correction residual amounts of respective substrate processing chambers PM1 to PM6.

In step S107, the overall control device 40 corrects the processing conditions of the pre-processing apparatus 10 based on the average value of the correction residual amounts. Here, when the average value of the correction residual amounts is a positive value, the thickness H of the etching target film 210 is reduced by the average value of the correction residual amounts. When the average value of the correction residual amounts is a negative value, the thickness H of the etching target film 210 is increased by the average value of the correction residual amounts. The overall control device 40 corrects the processing conditions of the pre-processing apparatus 10 based on the thickness H of the etching target film 210 after correction.

The overall control device 40 may store in advance a table in which the thicknesses H of the etching target film 210 and the processing conditions of the pre-processing apparatus 10 are associated with each other. The overall control device 40 corrects the processing conditions of the pre-processing apparatus 10 based on the average value of correction residual amounts and the table.

In step S108, the overall control device 40 corrects the processing conditions of respective substrate processing chambers PM1 to PM6 of the post-processing apparatus 20 based on the average value of correction residual amounts and the characteristics of respective substrate processing chambers PM1 to PM6 acquired in step S103.

Here, the target value of the etching depth D after correction is calculated from the difference between the thickness H and the required thickness R of the thin film portion 212 after correction. The overall control device 40 corrects the processing conditions of the substrate processing chambers PM1 to PM6 such that the characteristic value approaches the target value after correction. At this time, the correction may be performed with reference to the table representing the amounts of change in characteristic values with respect to process parameters.

In step S109, the overall control device 40 performs pre-processing process on the substrate W using the pre-processing apparatus 10 under the processing conditions after correction. Here, the controller 11 of the pre-processing apparatus 10 performs the pre-processing process on the substrate W under new processing conditions corrected in step S107.

In step S110, the overall control device 40 performs the post-processing process on the substrate W in the multiple substrate processing chambers PM1 to PM6 of the post-processing apparatus 20 under the processing conditions after correction. Here, the controller 21 of the post-processing apparatus 20 performs the post-processing process on the substrate W under new processing conditions corrected in step S108.

This makes it possible to suppress the variation of the characteristic values (etching depths D) among the substrate processing chambers PM. In addition, it is possible to suppress the variation in the thickness R of the thin film portion 212.

In the foregoing, the embodiment of a substrate-processing apparatus S or the like has been described. However, the present disclosure is not limited to the above-described embodiment or the like, and can be variously modified and improved within the scope of the gist of the present disclosure described in the claims.

The processing results in the pre-processing process (the diameter, width, and shape of the opening 221 in the hard mask film 220 in the first example, and the thickness H of the etching target film 210 of the second example) have been described as being uniform, but the present disclosure is not limited thereto. When there are variations in the processing results of respective substrates in the pre-processing process, the difference between a characteristic value and a target value may be calculated in consideration of the variations in the processing results in the pre-processing process.

According to an aspect, in a substrate processing apparatus that processes a plurality of substrates in parallel in multiple chambers, it is possible to provide a substrate processing method and a substrate processing apparatus, which suppress variations in processing results.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method of processing a plurality of substrates through a pre-processing process and a post-processing process, in which at least in the post-processing process, the plurality of substrates are processed in parallel in multiple chambers, the substrate processing method comprising:

performing the post-processing process on the plurality of substrates, which have been processed in the pre-processing process, in parallel in the multiple chambers;

acquiring a characteristic value of each of the substrates after performing the post-processing process for each of the chambers;

calculating an actual value, which is an estimated value of the characteristic value when a processing condition of the post-processing process is adjusted based on a difference between the characteristic value and a target value;

acquiring a correction residual amount, which is a difference between the actual value and the target value for each of the chambers;

calculating an average value of the correction residual amounts of all of the chambers;

correcting a processing condition of the pre-processing process based on the average value of the correction residual amounts;

correcting the processing condition of the post-processing process for each of the chambers based on the average value of the correction residual amounts and the correction residual amount for each of the chambers; and performing the pre-processing process based on the corrected processing condition of the pre-processing process and performing the post-processing process based on the corrected processing condition of the post-processing process, wherein the correcting the processing condition of the pre-processing process is performed with reference to a table in which the average value of the correction residual amounts stored in advance and the processing condition of the pre-processing process are associated with each other.

2. The substrate processing method of claim 1, wherein the difference between the characteristic value and the target value is calculated in consideration of a variation in a processing result of the pre-processing process.

3. The substrate processing method of claim 2, wherein the characteristic value is an average value of characteristic values of the plurality of substrates.

4. The substrate processing method of claim 3, wherein, in the calculating the actual value, the actual value is estimated with reference to a table representing an amount of change in the characteristic value for a process parameter stored in advance.

5. A substrate processing method of processing a plurality of substrates through a pre-processing process and a post-processing process, in which at least in the post-processing process, the plurality of substrates are processed in parallel in multiple chambers, the substrate processing method comprising:

performing the post-processing process on the plurality of substrates, which have been processed in the pre-processing process, in parallel in the multiple chambers;

acquiring a characteristic value of each of the substrates after performing the post-processing process for each of the chambers;

calculating an actual value, which is an estimated value of the characteristic value when a processing condition of the post-processing process is adjusted based on a difference between the characteristic value and a target value;

acquiring a correction residual amount, which is a difference between the actual value and the target value for each of the chambers;
calculating an average value of the correction residual amounts of all of the chambers;
correcting a processing condition of the pre-processing process based on the average value of the correction residual amounts;
correcting the processing condition of the post-processing process for each of the chambers based on the average value of the correction residual amounts and the correction residual amount for each of the chambers; and
performing the pre-processing process based on the corrected processing condition of the pre-processing process and performing the post-processing process based on the corrected processing condition of the post-processing process,
wherein the difference between the characteristic value and the target value is calculated in consideration of a variation in a processing result of the pre-processing process,
wherein the characteristic value is an average value of characteristic values of the plurality of substrates,
wherein, in the calculating the actual value, the actual value is estimated with reference to a table representing an amount of change in the characteristic value for a process parameter stored in advance, and
wherein the correcting the processing condition of the pre-processing process is performed with reference to a table in which the average value of the correction residual amounts stored in advance and the processing condition of the pre-processing process are associated with each other.

6. The substrate processing method of claim 5, wherein the correcting the processing condition of the post-processing process is performed with reference to the table representing the amount of change in the characteristic value for the process parameter stored in advance.

7. The substrate processing method of claim 1, wherein the characteristic value is an average value of characteristic values of the plurality of substrates.

8. The substrate processing method of claim 1, wherein, in the calculating the actual value, the actual value is estimated with reference to a table representing an amount of change in the characteristic value for a process parameter stored in advance.

9. The substrate processing method of claim 1, wherein the correcting the processing condition of the post-processing process is performed with reference to a table representing an amount of change in the characteristic value for a process parameter stored in advance.

10. A substrate processing apparatus comprising a pre-processing apparatus, a post-processing apparatus, and a controller,
wherein the controller is configured to execute the substrate processing method according to claim 1.

* * * * *